(12) United States Patent
Kawata

(10) Patent No.: US 8,263,982 B2
(45) Date of Patent: Sep. 11, 2012

(54) THIN FILM TRANSISTOR WITH A HIGH IMPURITY REGION OVERLAPPING THE GATE ELECTRODE

(75) Inventor: Hidenori Kawata, Chino (JP)

(73) Assignee: Seiko Epson Corporation, Tokyo (JP)

( * ) Notice: Subject to any disclaimer, the term of this patent is extended or adjusted under 35 U.S.C. 154(b) by 388 days.

(21) Appl. No.: 12/538,905

(22) Filed: Aug. 11, 2009

(65) Prior Publication Data

US 2010/0051948 A1 Mar. 4, 2010

(30) Foreign Application Priority Data

Sep. 1, 2008 (JP) .................. 2008-223131

(51) Int. Cl.
*H01L 31/112* (2006.01)
*H01L 21/00* (2006.01)

(52) U.S. Cl. ... 257/66; 257/336; 257/408; 257/E29.012; 257/E51.005; 257/E29.151; 257/E29.273; 438/149

(58) Field of Classification Search .................. None
See application file for complete search history.

(56) References Cited

U.S. PATENT DOCUMENTS

| | | | | |
|---|---|---|---|---|
| 5,093,703 A | * | 3/1992 | Minami et al. .................. 257/57 |
| 6,635,505 B2 | * | 10/2003 | Tanaka et al. ................... 438/30 |
| 6,649,317 B2 | * | 11/2003 | Wagner et al. ............. 430/123.5 |
| 7,119,402 B2 | | 10/2006 | Kinoshita et al. |
| 7,504,327 B2 | | 3/2009 | Yamazaki et al. |
| 7,566,903 B2 | * | 7/2009 | Yamazaki et al. .............. 257/59 |
| 7,943,935 B2 | * | 5/2011 | Ishiguro .......................... 257/66 |
| 7,956,362 B2 | * | 6/2011 | Yamazaki ....................... 257/72 |
| 8,008,140 B2 | * | 8/2011 | Yamaguchi et al. .......... 438/164 |
| 2005/0042785 A1 | * | 2/2005 | Okamoto ......................... 438/30 |
| 2007/0063147 A1 | * | 3/2007 | Yamazaki et al. ............ 250/424 |
| 2008/0121889 A1 | * | 5/2008 | Ishiguro .......................... 257/66 |
| 2009/0004872 A1 | * | 1/2009 | Okamoto ...................... 438/720 |

FOREIGN PATENT DOCUMENTS

| | | |
|---|---|---|
| JP | 2002-190597 A | 7/2002 |
| JP | 2005-101588 A | 4/2005 |
| JP | 2005-166729 A | 6/2005 |
| JP | 2006-32920 A | 2/2006 |
| JP | 2007-214495 A | 8/2007 |

* cited by examiner

*Primary Examiner* — Alonzo Chambliss
(74) *Attorney, Agent, or Firm* — AdvantEdge Law Group, LLC

(57) ABSTRACT

A thin film transistor includes a gate electrode and a semiconductor layer. The semiconductor layer includes a channel region, a source region, a drain region, a low-concentration impurity region provided between the channel region and the source or drain region and a high-concentration impurity region. The high-concentration impurity region overlaps with the gate electrode.

8 Claims, 12 Drawing Sheets

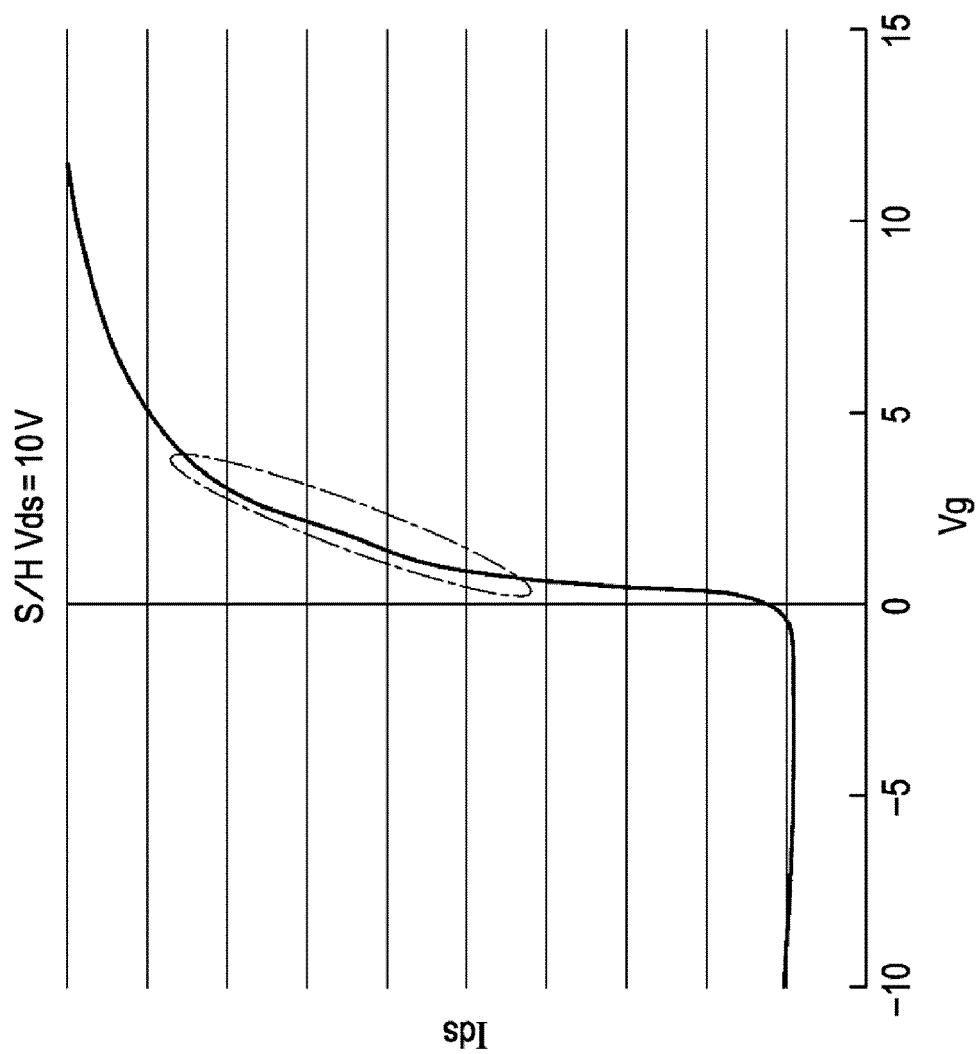

THIN FILM TRANSISTOR WITH A HIGH IMPURITY REGION OVERLAPPING THE GATE ELECTRODE

BACKGROUND

1. Technical Field

The present invention relates to a thin film transistor used for electro-optic devices, for example, a liquid crystal device and the like, and to an electro-optic device and an electronic apparatus.

2. Related Art

Thin film transistors have been used as switching elements for pixels or drive circuits in electro-optic devices such as a liquid crystal device and the like, for example, an active matrix-type liquid crystal display. For example, transistors for pixels are adapted for on-off control of image signals supplied to pixel electrodes. A transistor known as such a thin film transistor includes a gate electrode formed on a semiconductor layer through an insulating film, a channel region disposed in the semiconductor layer immediately below the gate electrode, and source and drain regions disposed in the semiconductor layer on both sides of the channel region.

Since it is necessary for such a thin film transistor to hold an image signal during the time from the supply of an image signal to a pixel electrode to the supply of a next image signal (i.e., within one frame), the OFF-current (Ioff), i.e., leakage current, is required to be small. In addition, a sufficient ON-current (Ion) is required for supplying an image signal to the pixel electrode. In particular, an image signal is required to be supplied within a shorter time with a recent increase in number of pixels, i.e., increase in definition.

Therefore, in order to comply with the above requirements, a so-called LDD (Light Doped Drain) structure thin film transistor has been proposed as a structure for decreasing a leakage current, in which a low-concentration impurity region having a lower impurity concentration than that in a channel region and source and drain regions is interposed between the channel region and the source and drain regions disposed on both sides of the channel region (refer to, for example, Japanese Unexamined Patent Application Publication No. 2002-190597).

FIG. 11 shows an example of the above-described LDD-structure thin film transistor, in which FIG. 11A is a plan view, FIG. 1B is a sectional view taken along line XIB-XIB in FIG. 11A in the channel length direction, and FIG. 11C is a sectional view taken along line XIC-XIC in FIG. 11A in the channel width direction. A thin film transistor 1 shown in the drawings includes a semiconductor layer 3 composed of polysilicon or the like and formed on a substrate (not shown) composited of quartz, glass, silicon, or the like, and a gate electrode 5 composed of low-resistance polysilicon or the like and formed on the semiconductor layer 3 through an insulating layer 4 composed of silicon oxide or the like. In addition, a channel region 30 is provided in the semiconductor layer 3 immediately below the gate electrode 5, and source and drain regions 33 and 34 are provided in the semiconductor layer 3 on both sides of the channel region 30 through respective LDD regions 32.

Each of the regions 30 to 34 is formed by ion implantation for introducing (doping) predetermined conductive impurities into the semiconductor layer 3. For example, in an N-channel-type transistor, generally, the N type is considered as first conductivity type, and the opposite conductivity type (different type) impurities, i.e., P-type impurities, are introduced into the channel region 30. Further, low-concentration N-type impurities are introduced into the LDD regions 32, and high-concentration N-type impurities are introduced into each of the source and drain regions 33 and 34. In a P-channel-type transistor, the conductivity types of impurities introduced are opposite to the above. In any one of the cases, N-type and P-type impurities may be introduced into the channel region 30, and no impurity may be introduced into the channel region 30.

However, a thin film transistor having the above-described configuration has the problem that it is difficult to secure a sufficiently high ON-current and sufficiently decrease a leakage current. The reason for this is the following: The ON-current of the thin film transistor is determined by the sheet resistance of the source and drain regions and the bulk resistivity of the semiconductor layer composed of polysilicon or the like. In addition, leakage of the source and drain regions is related to the amount of crystal defects in a PN junction (the energy of ion implantation and the amount of ions implanted, the degree of repair and recovery of lattice defects, and the like at the time of ion implantation) and the electric field strength (the impurity concentration in the semiconductor layer, the channel region, and the source and drain regions). Therefore, in order to decrease the impurity concentration at the PN junction, it is necessary to decrease the amount of channel doping (CD) in the LDD regions (N-regions) provided between the channel region and the source and drain regions. However, under the present situation, the amount is about 10 to 70%, and the dose in the source and drain regions is excessive (about 2 times or more the requirement). Under the present conditions, impurities are introduced over the entire surface of a channel doping region. Therefore, the sheet resistance is high for the high impurity concentration, and thus the ON-current is decreased and defects occur in the LDD regions at the time of impurity implantation, thereby causing the problem of increasing the leakage current.

The thin film transistor has a structure in which boundaries are formed at the ends of the semiconductor layer by usual etching, and the ends are covered with the gate electrode. The ends of the semiconductor layer covered with the gate electrode (in FIG. 11A, near regions surrounded by one-dot chain lines) are regions including etching damage, and thus the function of channel doping is different from in other regions of the semiconductor layer. Therefore, the threshold voltage in the end surfaces becomes smaller than that in the other regions of the semiconductor layer, thereby forming two types of transistors. As a result, as shown in FIG. 12, in the transmission characteristics of a transistor, there occurs the problem referred to as "kink" or "hump" (hereinafter generally named "hump" in this specification) that the ON-current decreases as shown by a one-dot chain line in FIG. 12.

SUMMARY

An advantage of some aspects of the invention is that the invention provides a thin film transistor capable of sufficiently decreasing a leakage current and securing a sufficient ON-current and a method for manufacturing the transistor, and also provides an electro-optic device and a method for manufacturing the same.

A thin film transistor, an electro-optic device, and an electronic apparatus according to embodiments of the present invention have the configurations below. Namely, a thin film transistor according to an embodiment of the present invention includes a semiconductor layer and a gate electrode provided on the semiconductor layer through an insulating film, wherein the semiconductor layer has a channel region, a source region, a drain region, and a low-concentration impurity region provided between the channel region and the source or drain region, and the channel region and a high-concentration impurity region having a higher impurity concentration than that in the channel region are provided in a region overlapping the gate electrode.

Specifically, for example, the high-concentration impurity region is disposed at least one of the ends of the region of the semiconductor layer in the channel length direction, the region overlapping the gate electrode. Alternatively, apart from or together with this, high-concentration impurity regions are disposed at both ends of the region of the semiconductor layer in the channel width direction, the region overlapping the gate electrode.

In a thin film transistor having the above-described configuration according to an embodiment of the invention, the operation and advantage described below are achieved. In order to decrease the impurity concentration at a PN junction, as described above, it is necessary to decrease the amount of channel doping (CD) in LDD regions (N-regions) provided between a channel region and source and drain regions. However, under the present situation, the amount is about 10 to 70%, and the dose in the source and drain regions is excessive (about 2 times or more the requirement). Under the present conditions, impurities are introduced over the entire surface of a channel doping region. However, in the present invention, the channel doping region is limited in the channel region in the channel length direction, and additional ion implantation need not be performed. Therefore, it is possible to secure characteristics even when the sheet resistance of a portion of the channel region is increased, suppress a decrease in ON-current, and contribute to a decrease in leakage current due to defects in the LDD regions.

When the above-described configuration is applied to the channel width direction of a thin film transistor, i.e., in a configuration in which the high-concentration impurity regions are disposed at both ends of the region of the semiconductor layer in the channel width direction, the region overlapping the gate electrode, the NCD ion concentration, i.e., the concentration of second conductivity-type impurities, is increased at the end surfaces of the semiconductor layer, but is decreased in a plane portion other than the end surfaces, thereby suppressing the concentration at the end surfaces of the semiconductor layer from exceeding a threshold value. Therefore, it is possible to sufficiently prevent the problem of a conventional transistor that two types of transistors are formed to decrease the ON-current, and the so-called hump occurs.

It is preferred that there is a difference in sheet resistance due to a difference in amount of impurities injected between the channel region and the high-concentration impurity region. In particular, it is preferred that the sheet resistance of the high-concentration impurity region is lower than that of the channel region. In this case, a thin film transistor with a high ON-current, a small leakage current, and excellent stability and performance can be achieved. In addition, the threshold voltage Vth of a thin film transistor is increased.

A method for manufacturing a thin film transistor according to an embodiment of the present invention is a method for manufacturing a thin film transistor including a semiconductor layer and a gate electrode provided on the semiconductor layer through an insulating film. The method includes forming the semiconductor layer on a substrate, forming the insulating film on the semiconductor layer, introducing impurities of a first conductivity type into a region of the semiconductor layer, which overlaps the gate electrode formed on the insulating film in a subsequent step, introducing impurities of a second conductivity type opposite to the first conductivity type into a region including and wider than the region of the semiconductor layer in which the impurities of the first conductivity type are introduced, forming the gate electrode on the insulating film, and introducing impurities of the same conductivity type as the first conductivity type impurities into the whole region of the semiconductor layer excluding the region overlapping the gate electrode.

When a thin film transistor is manufactured according to the above-described process, a thin film transistor with a high ON-current, a small leakage current, and excellent stability and performance as described above can be simply manufactured at low cost.

An electro-optic device according to an embodiment of the present invention includes a thin film transistor configured as described above and used as a switching element for a pixel or a drive circuit.

When the above-described thin film transistor is used as a switching element for a pixel or a drive circuit, image display or the like can be satisfactorily performed, and an electro-optic device having good display performance and stability can be provided.

Specifically, for example, when the above-described thin film transistor is used as a switching element for a pixel, the thin film transistor and a pixel electrode are provided corresponding to each of the intersections of scanning lines and data lines, and the gate electrode of the thin film transistor is electrically connected to the corresponding scanning line or serves as the scanning line. Further, one of the regions formed on both sides of the channel region in the semiconductor layer of the thin film transistor is electrically connected to the corresponding data line, and the other is electrically connected to the pixel electrode. In this case, it is preferred that the wiring resistance of the region connected to the pixel electrode is higher than that of the region connected to the data line. In this configuration, a leakage current from the pixel electrode can be decreased.

A method for manufacturing an electro-optic device according to an embodiment of the present invention is a method for manufacturing an electro-optic device using the above-described thin film transistor as a switching element for a pixel or a drive circuit. The method for manufacturing the electro-optic device includes manufacturing the above-described thin film transistor.

When a method for manufacturing an electro-optic device includes manufacturing the above-described thin film transistor, an electro-optic device using, as a switching element for a pixel or a drive circuit, a thin film transistor with a high ON-current, a small leakage current, and excellent stability and performance as described above can be simply manufactured at low cost.

An electronic apparatus according to an embodiment of the present invention includes the above-described electro-optic device. Therefore, an electronic apparatus including an electro-optic device having good performance as described above can be provided.

BRIEF DESCRIPTION OF THE DRAWINGS

The invention will be described with reference to the accompanying drawings, wherein like numbers reference like elements.

FIG. 12 is a graph showing transmission characteristics of a conventional thin film transistor.

DESCRIPTION OF EXEMPLARY EMBODIMENTS

Figure 1A:
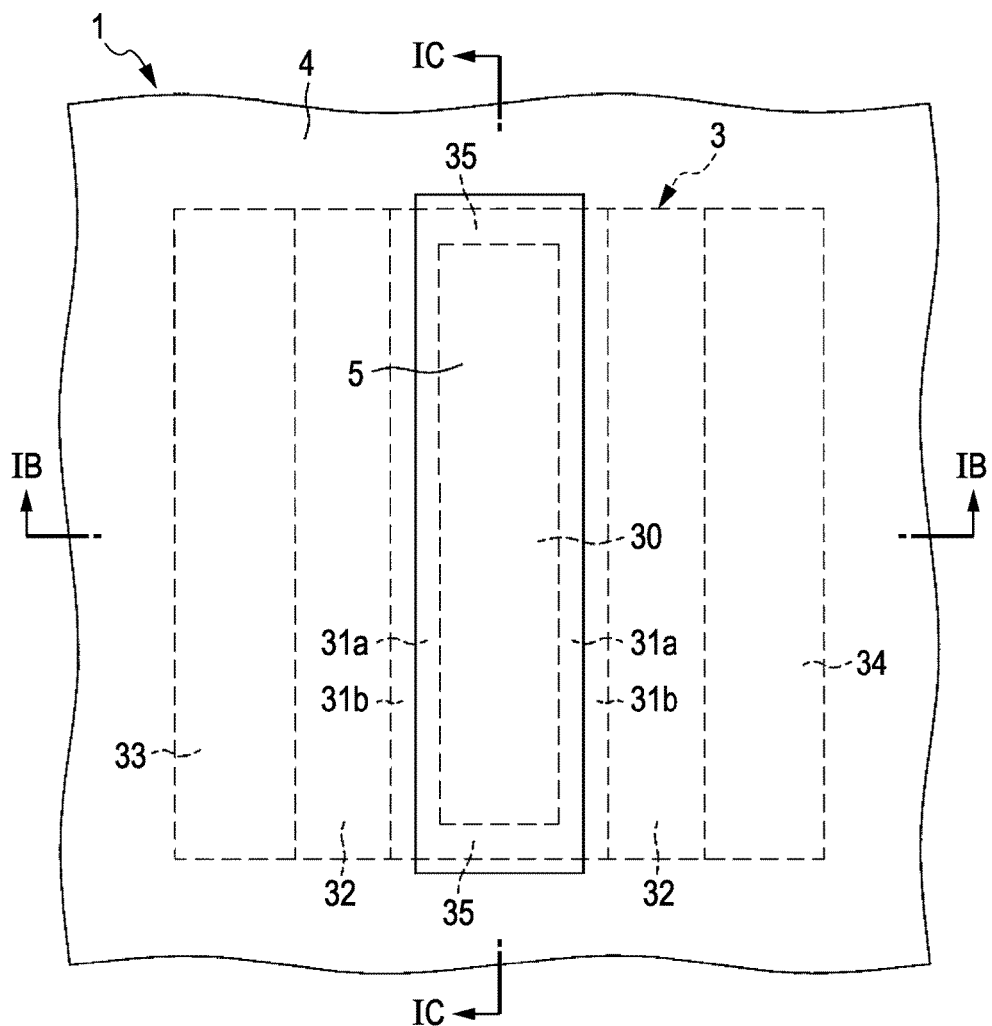
FIG. 1A is a plan view showing a thin film transistor according to an embodiment of the present invention.

A thin film transistor, a method for manufacturing the same, an electro-optic device, and a method for manufacturing the same according to the present invention are described in detail below with reference to embodiments shown in the drawings.

Thin Film Transistor

Figure 1B:
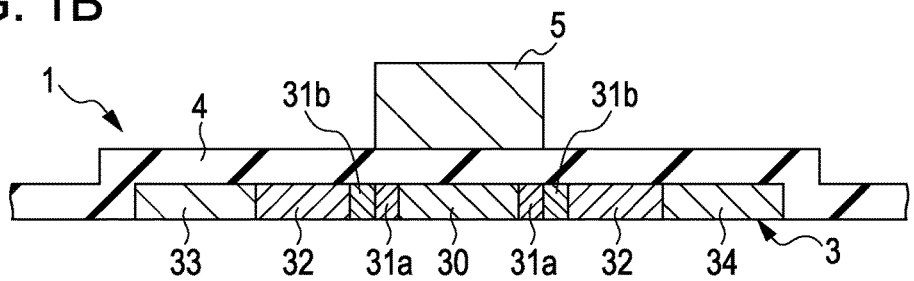
FIG. 1B is a sectional view taken along line IB-IB in FIG. 1A.
Figure 1C:
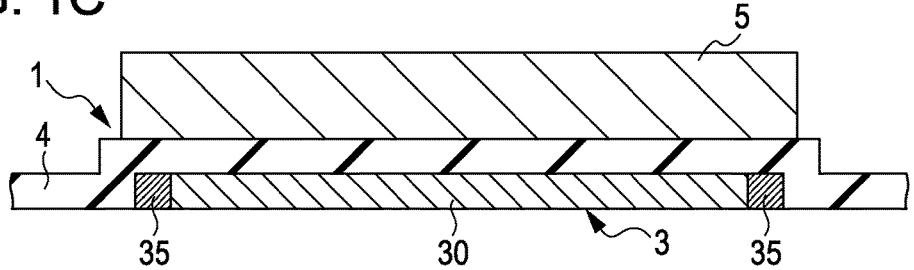
FIG. 1C is a sectional view taken along line IC-IC in FIG. 1A.
Figure 11A:
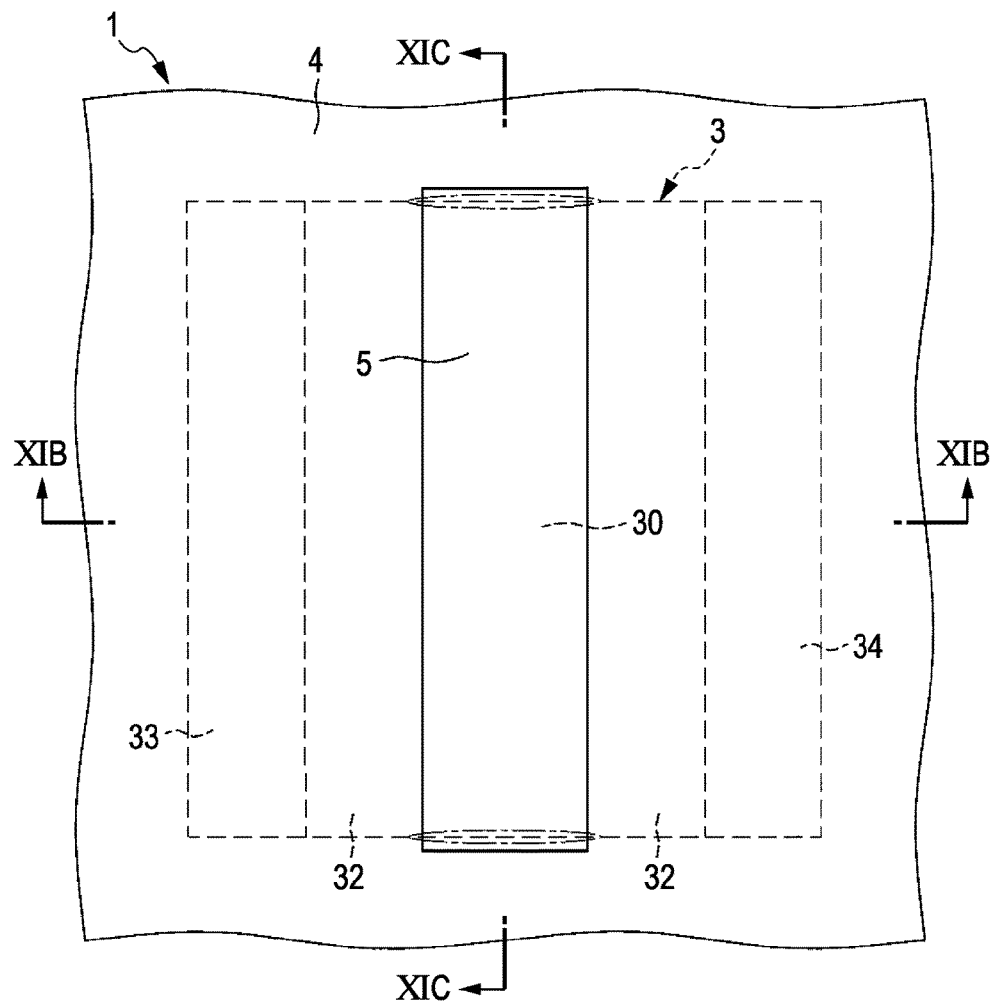
FIG. 11A is a plan view showing a conventional thin film transistor.
Figure 11B:
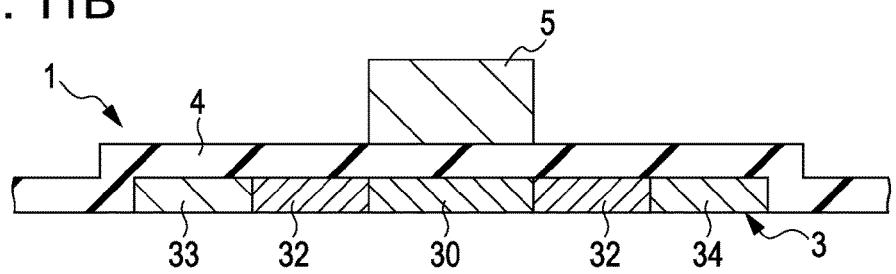
FIG. 11B is a sectional view taken along line XIB-XIB in FIG. 11A.
Figure 11C:
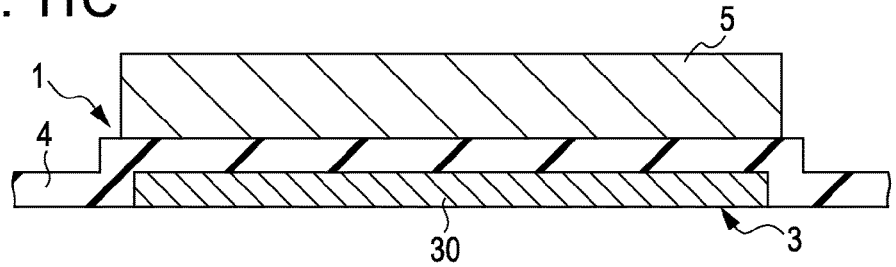
FIG. 11C is a sectional view taken along line XIC-XIC in FIG. 11A.

FIGS. 1A, 1B, and 1C show a thin film transistor according to an embodiment of the present invention. FIG. 1A is a plan view. FIG. 1B is a sectional view in the channel length direction, taken along line IB-IB in FIG. 1A. FIG. 1C is a sectional view in the channel width direction, taken along line IC-IC in FIG. 1A. A member having the same function as in the conventional example shown in FIG. 11 is denoted by the same reference numeral for description.

Like a conventional example, a thin film transistor (TFT) 1 according to this embodiment includes a semiconductor layer 3 composed of polysilicon or the like and formed on a substrate (not shown) composed of quartz, glass, silicon, or the like, and a gate electrode 5 composed of low-resistance polysilicon or the like and provided on the semiconductor layer 3 through an insulating layer 4 composed of silicon oxide or the like.

The semiconductor layer 3 has a channel region 30 overlapping the gate electrode 5, and high-concentration impurity regions 31a having a higher impurity concentration than that of the channel region 30. In this embodiment, the channel region 30 is provided inward of the gate electrode 5, and high-concentration impurity regions 31a and 35 are provided on both sides of the channel region 30 in the channel length direction (lateral direction in FIG. 1B) and the channel width direction (lateral direction in FIG. 1C), respectively.

The high-concentration impurity regions 31a and 35 may have a substantially higher concentration of impurities generally introduced than that of the channel region 30. For example, in an N channel-type transistor, the N type is considered as first conductivity type, and impurities of P-type which is second conductivity type opposite to the first conductivity type are introduced into the channel region 30. In this case, only impurities of the second conductivity type which is the same as the channel region 30 may be introduced into the second conductivity type high-concentration impurity regions 31a in an amount larger than that of the channel region 30. Alternatively, impurities of both the first and second conductivity types may be introduced so that a dose obtained by subtracting the dose of impurities of the first conductivity type from the dose of impurities of the second conductivity type in the second conductivity-type high-concentration impurity regions 31a is larger than that in the channel region 30. In a P channel-type transistor, P type and N type may be considered as the first conductivity type and the second conductivity type, respectively, and the configuration may be the same as the above.

In this embodiment, the thin film transistor is a N channel-type transistor, and thus phosphorus as impurities of N type which is the first conductivity type and boron as impurities of P type which is the second conductivity type in a larger amount (dose) are introduced into the channel region 30. In addition, impurities of the first conductivity type are not introduced into the second conductivity-type high-concentration impurity regions 31a, and only boron as impurities of P type which is the second conductivity type are introduced into the second conductivity type high-concentration impurity regions 31a in the same amount as in the channel region 30.

In the channel length direction in FIG. 1B, a source region 33 and a drain region 34 in each of which phosphorus as impurities of N-type which is the first conductivity type is introduced at a high concentration are provided on both ends of the second conductivity-type high-concentration impurity regions 31a in the semiconductor layer 3. In addition, LDD regions 32 as an example of a low-concentration impurity region are provided on the channel region sides of the source region 33 and the drain region 34. In each of the LDD regions 32, like in the source region 33 and the drain region 34, phosphorus as impurities of N-type which is the first conductivity type is introduced at a lower concentration than that of the source region 33 and the drain region 34.

Further, the second conductivity-type high-concentration impurity region 31a and a both conductivity-type impurity region 31b into which impurities of both the first and second conductivity types are introduced are provided between each of the LDD regions 32 and the channel region 30, the both conductivity-type impurity region 31b being disposed outside of the second conductivity-type high-concentration impurity region 31a. In this embodiment, in each of the both conductivity-type impurity regions 31b, the same impurities of the second conductivity type as in the second conductivity-type high-concentration impurity regions 31a are introduced in the same amount and the same impurities of the first conductivity type as in the LDD regions 32 are introduced in the same amount. In the both conductivity-type impurity regions 31b, the impurities of the first conductivity type are diluted with the impurities of the second conductivity type opposite to the first conductivity type. Therefore, the both conductivity-type impurity regions 31b function as first conductivity-type regions having a lower concentration of first conductivity-type impurities than that in the LDD regions 32, thereby imparting, in combination with the LDD regions 32, the same function as in the case where two-stage LDD regions 32 and 31b are provided. The both conductivity-type impurity regions 31b may be not necessarily provided, and the LDD regions 32 may be omitted according to circumstances.

Figure 2:
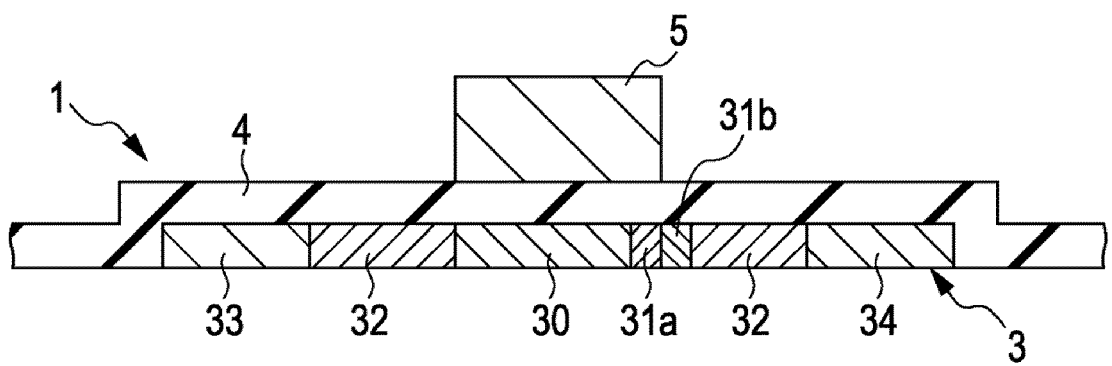
FIG. 2 is a longitudinal sectional view showing a thin film transistor according to another embodiment of the present invention.

In the embodiment, in a region of the semiconductor layer 3, which overlaps the gate electrode 5, in the channel length direction in FIG. 1B, each of the second conductivity-type high-concentration impurity regions 31a ranges from a position corresponding to a position inside of an end of the gate electrode 5 to a position corresponding to an end of the gate electrode 5. However, the range may be appropriately determined as long as it is inside of at least a position corresponding to an end of the gate electrode 5 and outside of the channel region 3. In addition, in the embodiment, the second conductivity-type high-concentration impurity regions 31a are provided on both sides of the channel region 30. However, the second conductivity-type high-concentration impurity region 31a may be provided one of the sides, for example, the drain region 34 side as shown in FIG. 2.

As described above, the thin film transistor according to the present invention has the semiconductor layer 3 in which the channel region 30 and the second conductivity-type high-concentration impurity regions 31a having a higher concentration of second conductivity-type impurities than that in the channel region 30 are provided in the region overlapping the gate electrode 5. Therefore, as described above, the channel doping region in the channel region is limited, and additional ion implantation need not be performed. Therefore, it is possible to secure characteristics even when the sheet resistance of a portion of the channel region is decreased, suppress a decrease in ON-current, and contribute to a decrease in leakage current.

When the above-described configuration is applied to the channel width direction of a thin film transistor, the concentration of second conductivity-type impurities (ion concentration for NCD (final P-type boron concentration: sheet resistance)) is increased at the end surfaces of the semiconductor layer, but the ion concentration for NCD is decreased in a plane portion other than the end surfaces, thereby suppressing the concentration at the end surfaces of the semiconductor layer from exceeding a threshold value. Therefore, it is possible to achieve the effect of resolving the problem that two types of transistors are formed, and satisfactorily preventing a decrease in ON-current due to a current loss.

Although, in the embodiment, the configuration is applied to both the channel length direction and the channel width direction of the thin film transistor, the configuration may be applied to only one of the directions. When the configuration is applied to only the channel length direction, there is the effect of suppressing a decrease in ON-current and decreasing the leakage current. When the configuration is applied to only the channel width direction, it is possible to resolve the problem that two types of transistors are formed to decrease the ON-current, and the so-called hump occurs.

[Method for Manufacturing Thin-Film Transistor]

Next, the methods for manufacturing the thin-film transistor in the channel length direction and the channel width direction according to an embodiment of the present invention are separately described by the case as an example in which the method is applied to the thin-film transistor shown in FIGS. 1A to 1C. FIGS. 3A to 3E and 4A to 4B' are sectional views in the channel length direction, showing an example of a manufacturing process for a thin-film transistor shown in FIG. 1, particularly an N-channel-type transistor. In the drawings, arrows show a state in which impurities are introduced by ion implantation or the like.

Figure 3A:
FIGS. 3A to 3E are explanatory views showing an example of a process for manufacturing the thin film transistor shown in FIG. 1A in the channel length direction.

First, as shown in FIG. 3A, a semiconductor layer 3 having a predetermined planar shape and composed of polysilicon is formed on a substrate (not shown) composed of quartz, glass, silicon, or the like. A proper method is used as the method of forming the semiconductor layer 3, but, for example, an amorphous silicon film formed on the substrate by reduced-pressure CVD is heat-treated in a nitrogen atmosphere to form a polysilicon film, and the polysilicon film is formed to a predetermined thickness by solid-phase growth by annealing or the like and then formed in a predetermined pattern by photolithography and etching.

Next, an insulating film 4 composed of silicon oxide is formed on the semiconductor layer 3. The insulating film 4 can be easily formed by, for example, thermally oxidizing the semiconductor layer 3 composed of polysilicon at a temperature of about 900 to 1300° C., preferably a temperature of about 1000° C. The insulating film 4 may be a multilayer film including, for example, a high-temperature silicon oxide film (HTO film).

Figure 3B:
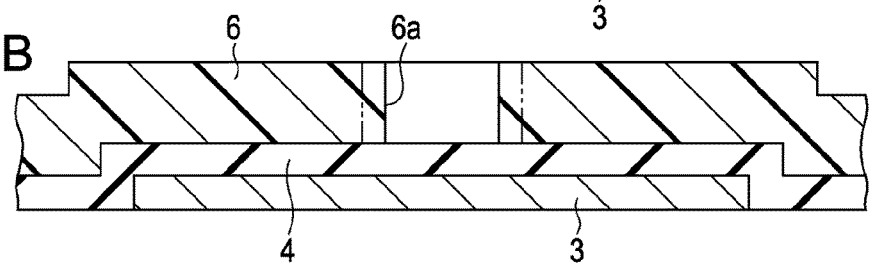
Figure 3C:
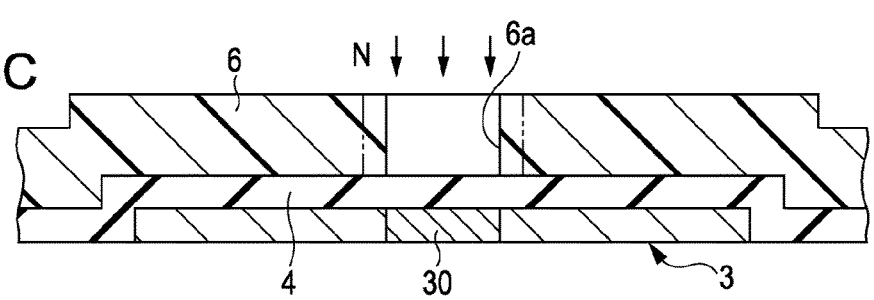
Figure 3C:
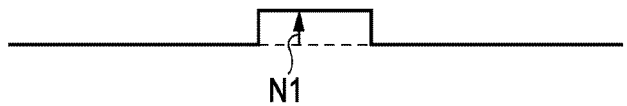

Next, a channel region 30 is formed in a region narrower than a region overlapping the gate electrode 5 at substantially the center in the channel length direction of the semiconductor layer 3 covered with the insulating film 4, and second conductivity-type high-concentration impurity regions 31a are formed on both sides of the channel region 30. First, as shown in FIG. 3B, a mask 6 composed of photoresist or the like is formed on the insulating film 4, the mask 6 having an opening 6a in a region narrower than a region (shown by two-dot chain lines in FIG. 3B) overlapping the gate electrode 5 formed in a subsequent step. Then, as shown in FIG. 3C, impurities of N-type which is the first conductivity type opposite to original channel doping are introduced into the insulating film 4 through the opening 6a. In this embodiment, the length of the opening 6a corresponding to the channel region 30 in the channel length direction is smaller than that of the gate electrode 5 by, for example, about 0.2 to 0.4 μm on one of the sides. In addition, phosphorus ions are implanted as N-type impurities through the opening 6a at 30 to 40 eV in a dose of 0.5 to $1.5 \times 10^{12}/cm^2$. FIG. 3C' is a graph showing a dose to the semiconductor layer 3 after implantation. The graph indicates that impurities of N-type which is the first conductivity type are introduced into the channel region 30 corresponding to the opening 6a in an amount N1 corresponding to a projection in FIG. 3C'.

Figure 3D:
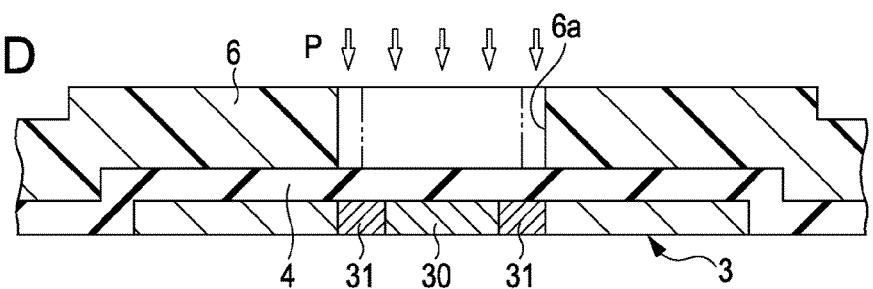
Figure 3D:
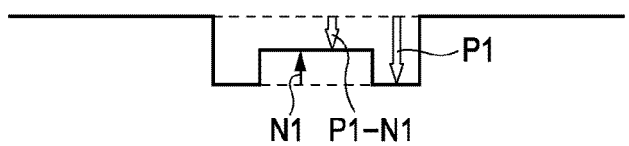

Next, as shown in FIG. 3D, the opening 6a of the mask 6 is enlarged by resist etching using ashing, $O_2$ cleaning, or the like, and then impurities of P-type which is the second conductivity type corresponding to original channel doping are introduced through the opening 6a. In the resist etching, the opening 6a is preferably extended by at least 0.35 μm or more on one of the sides in view of an alignment deviation between the gate electrode and the mask for patterning. In this embodiment, the opening 6a is extended by ashing, $O_2$ cleaning, or the like to a region wider than the region overlapping the gate electrode 5. In addition, boron ions are implanted as P-type impurities through the opening 6a at 30 to 40 eV in a dose of 2 to $4 \times 10^{12}/cm^2$. FIG. 3D' shows a dose to the semiconductor layer 3 after implantation. The figure indicates that impurities N1 of N-type which is the first conductivity type shown by an upward arrow and a larger amount of impurities P1 of P-type which is the second conductivity type shown by a downward arrow are introduced into the channel region 30. Therefore, impurities are introduced into the channel region 30 in a dose (carrier concentration) corresponding to a difference P1−N1. In addition, second conductivity-type high-concentration impurity regions 31 into which only impurities P1 of P-type as the second conductivity type are introduced are formed on both sides of the channel region 30.

Figure 3E:
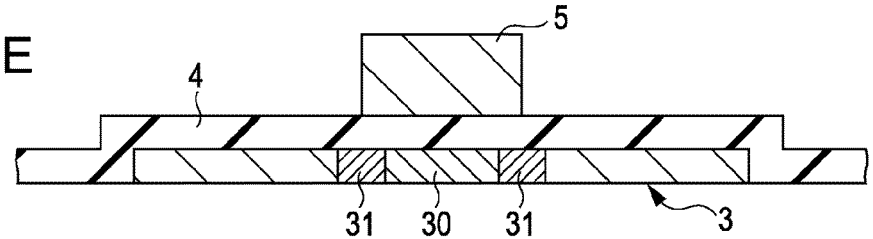

Next, the mask 6 on the insulating film 4 is removed by etching or the like, and then the gate electrode 5 is formed on the insulating film 4 as shown in FIG. 3E. The material and method for forming the gate electrode 5 are appropriately selected. For example, a polysilicon film is deposited on the insulating film 4 by reduced-pressure CVD or the like, and the polysilicon film is made conductive by thermal diffusion of phosphorus (P). Instead of the thermal diffusion, a doped silicon film may be formed by introducing P ions at the same time as deposition of the polysilicon film. The thickness of the polysilicon film is about 100 to 500 nm, preferably about 350 nm. Then, the polysilicon film is annealed to thermally diffuse the impurities implanted into the semiconductor layer 4, and then the gate electrode 5 having a predetermined pattern is formed by photolithography and etching.

Figure 4A:
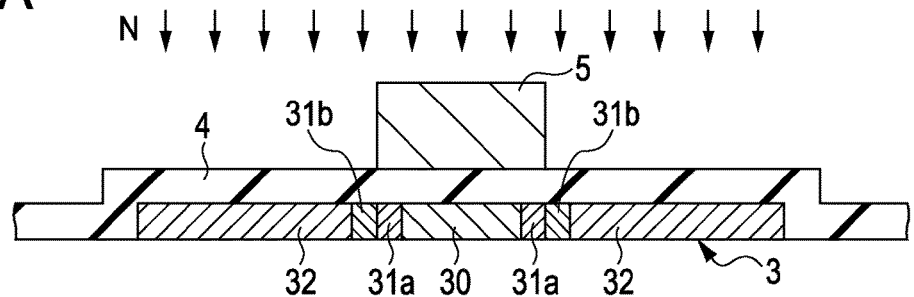
FIGS. 4A to 4B' are explanatory views showing a manufacturing process continued from FIG. 3E.
Figure 4A:
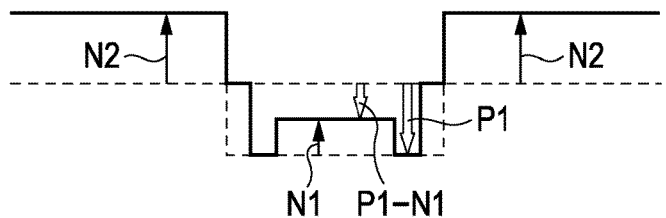

Next, in order to form the LDD regions 32 in the semiconductor layer 3 as shown in FIG. 1A, impurities of N-type which is the first conductivity type are introduced from above the gate electrode 5 using the gate electrode 5 as a mask as shown in FIG. 4A. In this embodiment, phosphorus ions are implanted as the N-type impurities in a dose of 2 to $4 \times 10^{13}/cm^2$. FIG. 4A' shows a dose to the semiconductor layer 3 after implantation. In the state shown in FIG. 4A', N-type impurities are introduced into regions other than the gate electrode 5 in a constant dose N2, and the LDD regions 32 are formed in the semiconductor layer 3 outside of the channel region 30 and the second conductivity-type high-concentration impurity regions 31.

In the second conductivity-type high-concentration impurity regions 31, the above-described impurities are not introduced into the regions 31a overlapping the gate electrode 5 so that the second conductivity-type high-concentration impurity regions are maintained. Further, the second conductivity-type impurities introduced in FIG. 3D and the impurities N2 of N-type which is the first conductivity type are introduced, in substantially the same dose in this embodiment, into the regions 31b of the second conductivity-type high-concentration impurity regions 31 outside of the gate electrode 5 to form both conductivity-type impurity regions. The both conductivity-type impurity regions 31b are allowed to function as regions having a lower concentration of first conductivity-type impurities than that in the LDD regions 32.

Figure 4B:
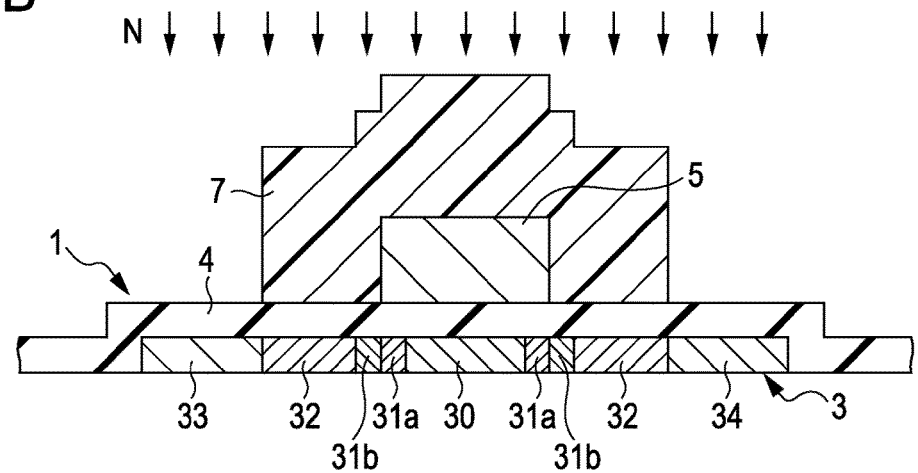
Figure 4B:
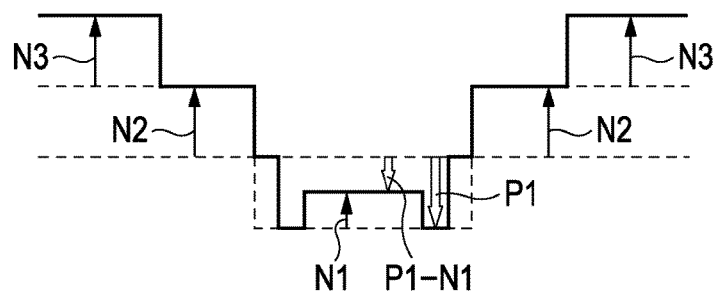

Next, in order to form the source region 33 and the drain region 34 at both ends of the semiconductor layer 3, as shown in FIG. 4B, a photoresist mask having a planar pattern wider than the gate electrode 5 is formed on the gate electrode 5. Then, the same impurities of N-type which is the first conductivity type as the above are introduced from above the mask 7. In this embodiment, phosphorus ions are implanted as the N-type impurities in a dose of 2 to $4 \times 10^{15}/cm^2$. FIG. 4B' shows a dose to the semiconductor layer 3 after implantation. The dose to the LDD regions 32 remains at the N2, and in the source regions 33 and the drain region 34, the impurities N2 and impurities N3 of N-type which is the first conductivity type are introduced so that combination of impurities N2 and N3 are introduced. Finally, the mask 7 is removed to produce a thin film transistor as shown in FIGS. 1A to 1C.

As described above, according to the method for manufacturing the thin film transistor of the present invention, a thin-film transistor having a high ON-current and a small leakage current as described above can be simply manufactured through the above-mentioned process. In particular, when impurities of N-type as the first conductivity type and impurities of P-type as the second conductivity type are introduced into the semiconductor layer 3 in the region overlapping the gate electrode 5, the common mask 6 is used by resist etching of the opening 6a using ashing, $O_2$ cleaning, or the like. Therefore, the impurities can be easily and rapidly introduced.

In the embodiment shown in FIGS. 3A to 3E and 4A to 4B', an example of the manufacturing process in which the second conductivity-type high-concentration impurity regions 31a are formed on both sides of the channel region 30 as shown in FIG. 1B is described. However, as described above, the second conductivity-type high-concentration impurity region 31a may be provided on one of the sides of the channel region 30, for example, only the drain region 34 side as shown in FIG. 2. An example of the manufacturing process for this case is shown in FIGS. 5A to 5E and 6A to 6B'. In the drawings, the manufacturing process for a right half, i.e., on the drain region 34 side, is the same as that shown in FIGS. 3A to 3E and 4A to 4B', while the manufacturing process for a left half is the same as that shown in FIGS. 3A to 3E and 4A to 4B' except that the source region-side end (the left end in the drawings) of the opening 6a shown in FIGS. 3A to 3D is allowed to coincide with the source region-side end of the gate electrode 5 formed on the insulating layer 4. When a thin-film transistor is manufactured according to the manufacturing process shown in 5A to 5E and 6A to 6B', the thin-film transistor shown in FIG. 2 can be easily manufactured at low cost, and the same operation and effect as described above can be achieved.

In each of the embodiments, description is made of the channel length direction of the thin film transistor shown in FIGS. 1B and 2. However, as described above, the present invention can be applied to the channel width direction shown in FIG. 1C. An example of the manufacturing process in the channel width direction is described on the basis of FIGS. 7A to 7E. The manufacturing process shown in FIGS. 7A to 7E corresponds to the manufacturing process shown in FIGS. 3A to 3E or FIGS. 5A to 5E. When the present invention is applied to both the channel length direction and width direction of a thin film transistor as shown in FIGS. 1A to 1C, in the channel length direction, the thin film transistor is manufactured according to the process shown in FIGS. 3A to 3E or 5A to 5E and the process shown in FIGS. 4A to 4B' or 6A to 6B'. During the manufacture according to the process shown in FIGS. 3A to 3E or 5A to 5E, in the channel width direction, the thin film transistor may be manufactured according to the process shown in FIGS. 7A to 7E described below.

Figure 5A:
FIGS. 5A to 5E are explanatory views showing an example of a process for manufacturing the thin film transistor shown in FIG. 2.
Figure 7A:
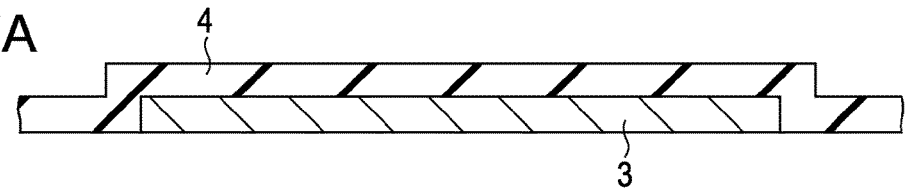
FIGS. 7A to 7E are explanatory views showing an example of a process for manufacturing the thin film transistor shown in FIG. 1A in the channel width direction.

First, as shown in FIG. 7A corresponding to FIG. 3A or 5A, the semiconductor layer 3 having a predetermined planar shape and composed of polysilicon is formed on the substrate composed of quartz, glass, silicon, or the like, and the insulating layer 4 composed of silicon oxide or the like is formed on the semiconductor layer 3. The semiconductor layer 3 may be formed in a predetermined length in the channel width direction (lateral direction in FIGS. 7A to 7E).

Figure 5B:
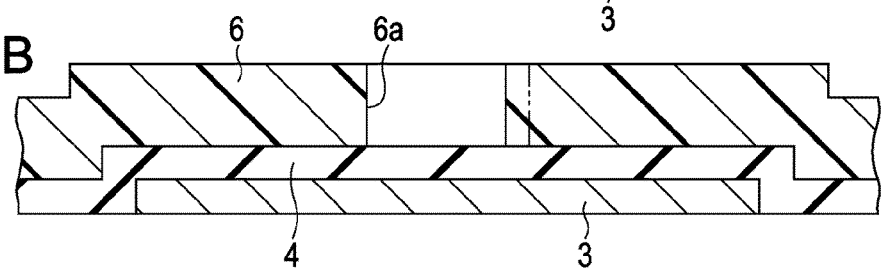
Figure 5C:
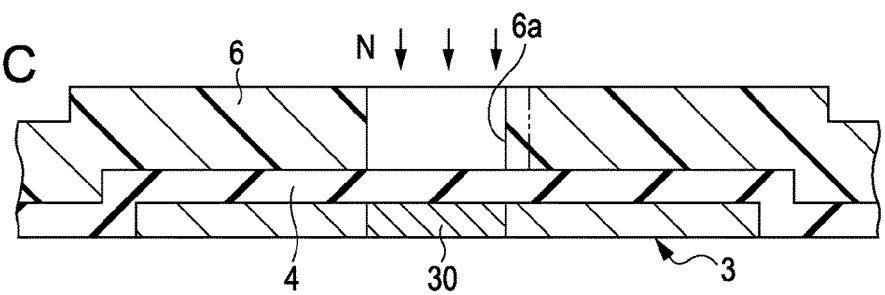
Figure 5C:
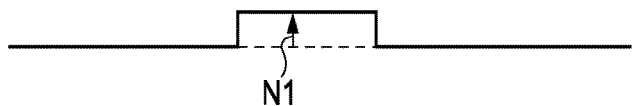
Figure 7B:
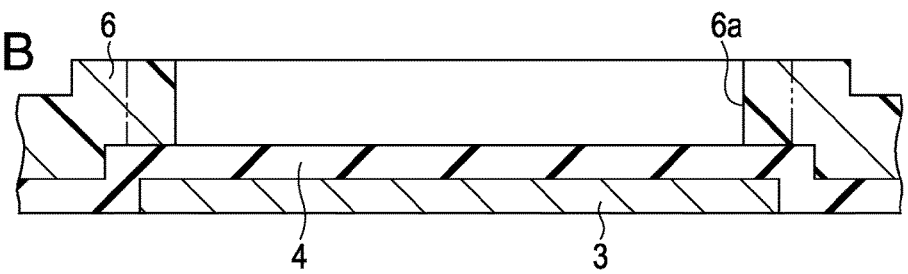
Figure 7C:
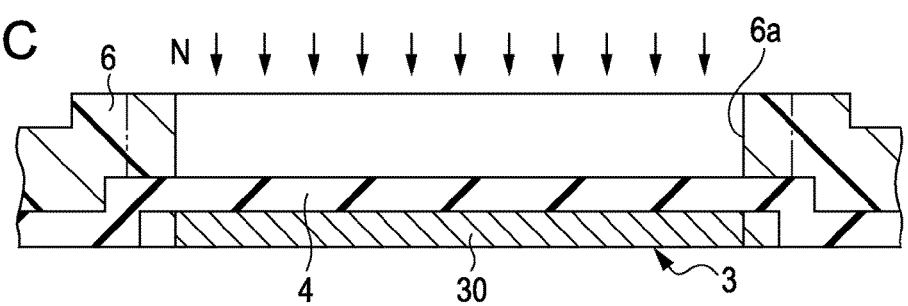

Next, in FIG. 7B corresponding to FIG. 3B or 5B, the mask 6 is formed on the insulating film 4, the mask 6 having the opening 6a in a region narrower than a region (shown by two-dot chain lines in FIG. 7B) overlapping the gate electrode 5 formed in a subsequent step. Then, as shown in FIG. 7C corresponding to FIG. 3C or 5C, impurities of N-type which is the first conductivity type opposite to original channel doping are introduced into the insulating film 4 through the opening 6a.

Figure 5D:
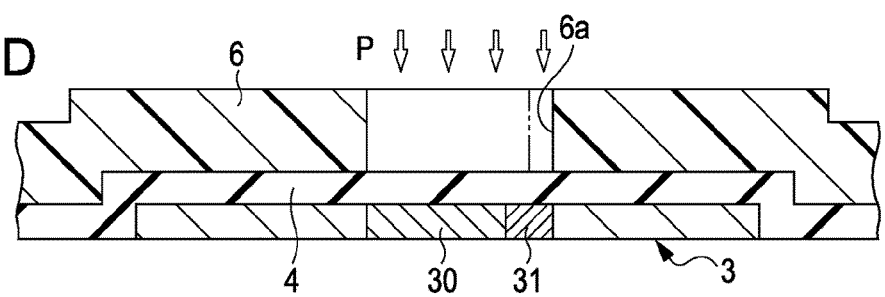
Figure 5D:
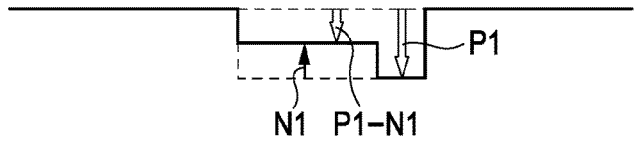
Figure 7D:
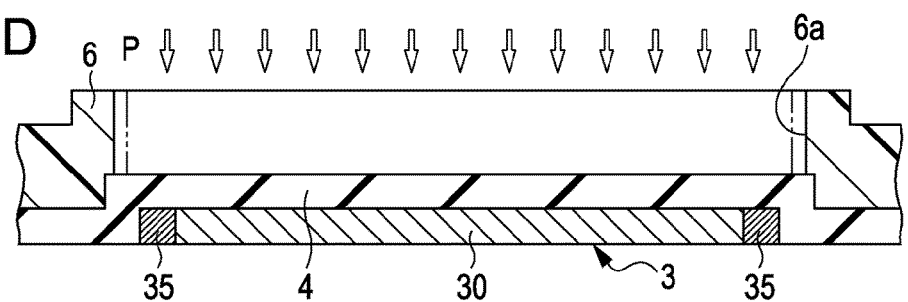

Next, as shown in FIG. 7D corresponding to FIG. 3D or 5D, the opening 6a of the mask 6 is enlarged by resist etching with ashing, $O_2$ cleaning, or the like. In the resist etching, the opening 6a is preferably extended to be larger than the length of the semiconductor layer 3 in the channel width direction.

Then, impurities of P-type which corresponds to original channel doping are introduced through the opening 6a in the same manner as in FIG. 3D or 5D. As a result, like in FIG. 3D or 5D, impurities N1 of N-type which is the first conductivity type shown by an upward arrow and a larger amount of impurities P1 of P-type which is the second conductivity type shown by a downward arrow are introduced into the normal channel region 30 excluding both ends of the semiconductor layer 3. Therefore, the impurities P1 are introduced into the channel region 30 in an amount larger by a dose P1' corresponding to the above-described difference P1−N1. In addition, second conductivity-type impurity regions 35 into which only impurities of P-type as the second conductivity type are introduced are formed on both sides of the channel region 30 in the channel width direction.

Figure 5E:
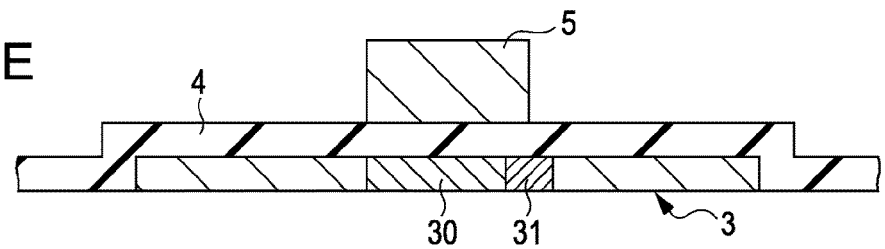
Figure 6A:
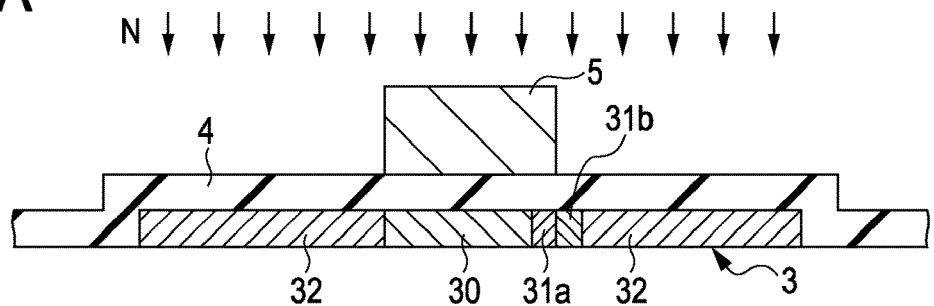
FIGS. 6A to 6B' are explanatory views showing a manufacturing process continued from FIG. 5E.
Figure 6A:
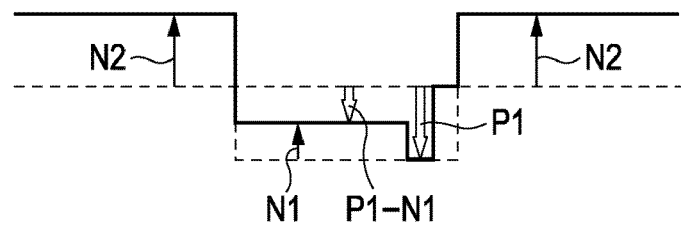
Figure 6B:
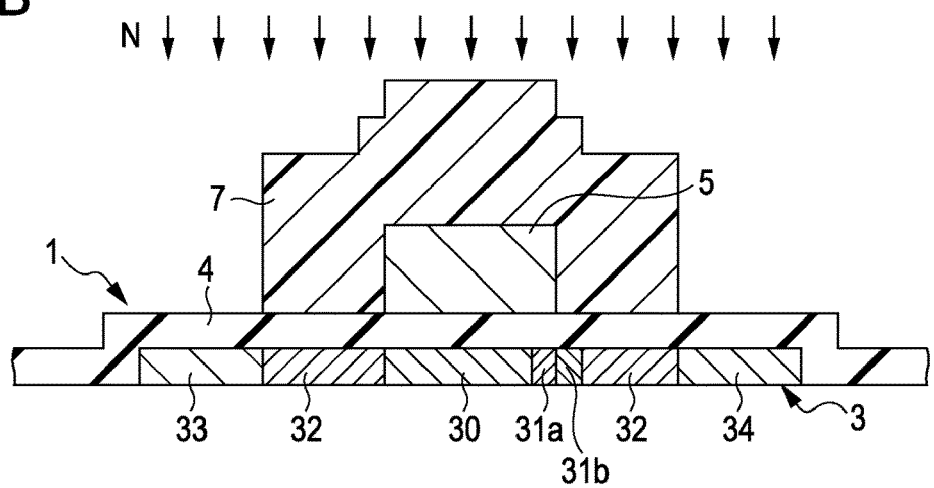
Figure 6B:
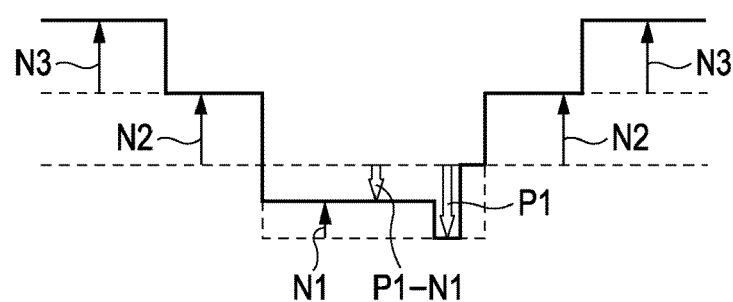
Figure 7E:
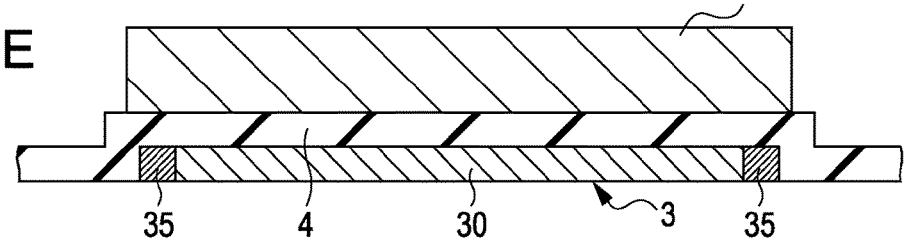

Next, as shown in FIG. 7E corresponding to FIG. 3E or 5E, the gate electrode 5 is formed on the insulating film 4. Then, the LDD regions 32, the source region 33, and the drain region 34 may be formed in the same manner as described above with reference to FIGS. 4A to 4B' or 6A to 6B'. According to the above-described process, like in the channel length direction, in the channel width direction, the channel region 30 and the second conductivity-type high-concentration impurity regions 35 having a higher concentration of second conductivity-type impurities than that in the channel region 30 can be easily formed. In particular, the problem of forming two types of transistors can be easily securely resolved by forming the second conductivity-type high-concentration impurity regions 35 on both sides of the semiconductor layer 3 in the channel width direction. In addition, the step of forming the second conductivity-type high-concentration impurity region 31a on at least one of the ends in the channel length direction and the step of forming the second conductivity-type high-concentration impurity regions 35 at both ends in the channel width direction can be simultaneously easily performed by a substantially common process.

Although, in the above-described embodiments, the present invention is applied to both the channel length direction and the channel width direction of the thin film transistor, the invention can be applied to only one of the directions. In this case, the same operation and effect as described above can be achieved.

[Electro-Optic Device]

Next, an electro-optic device and a method for manufacturing the same according to an embodiment of the invention are described with reference to the case, as an example, in which the above-described thin film transistor is applied to a liquid crystal.

Figure 8A:
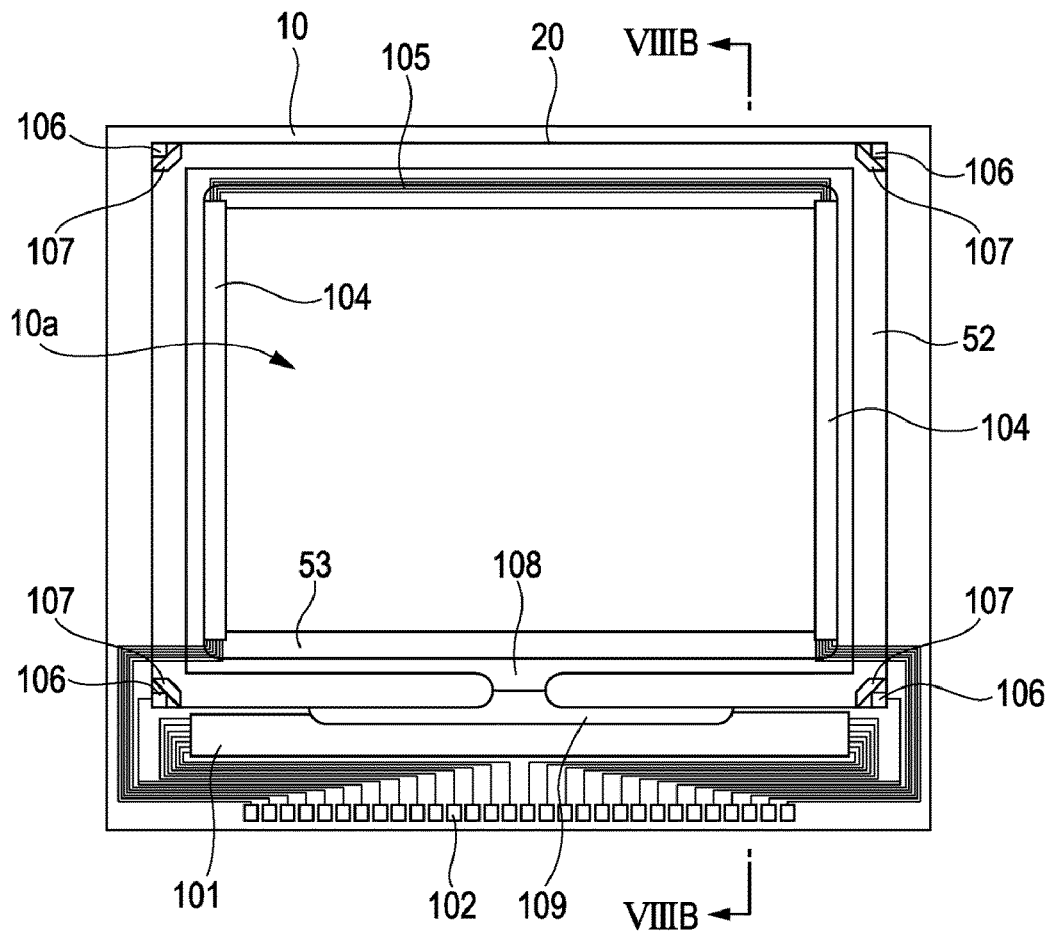
FIG. 8A is a plan view showing an electro-optic device according to an embodiment of the present invention.
Figure 8B:
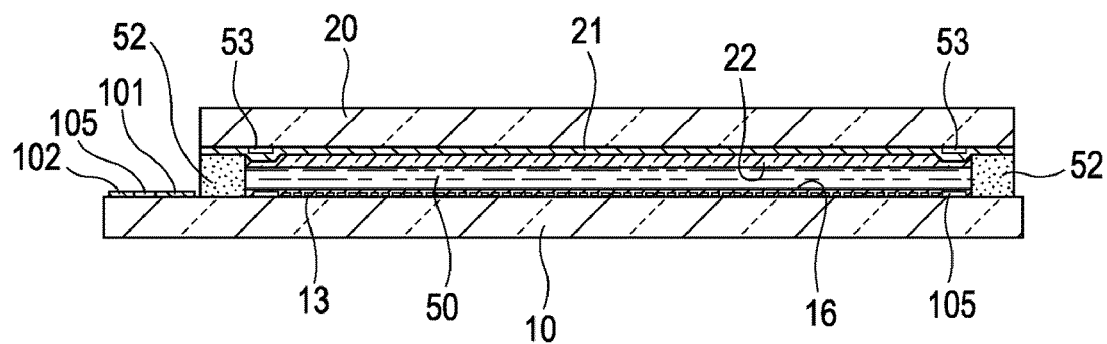
FIG. 8B is a sectional view taken along line VIIIB-VIIIB in FIG. 8A.
Figure 9:
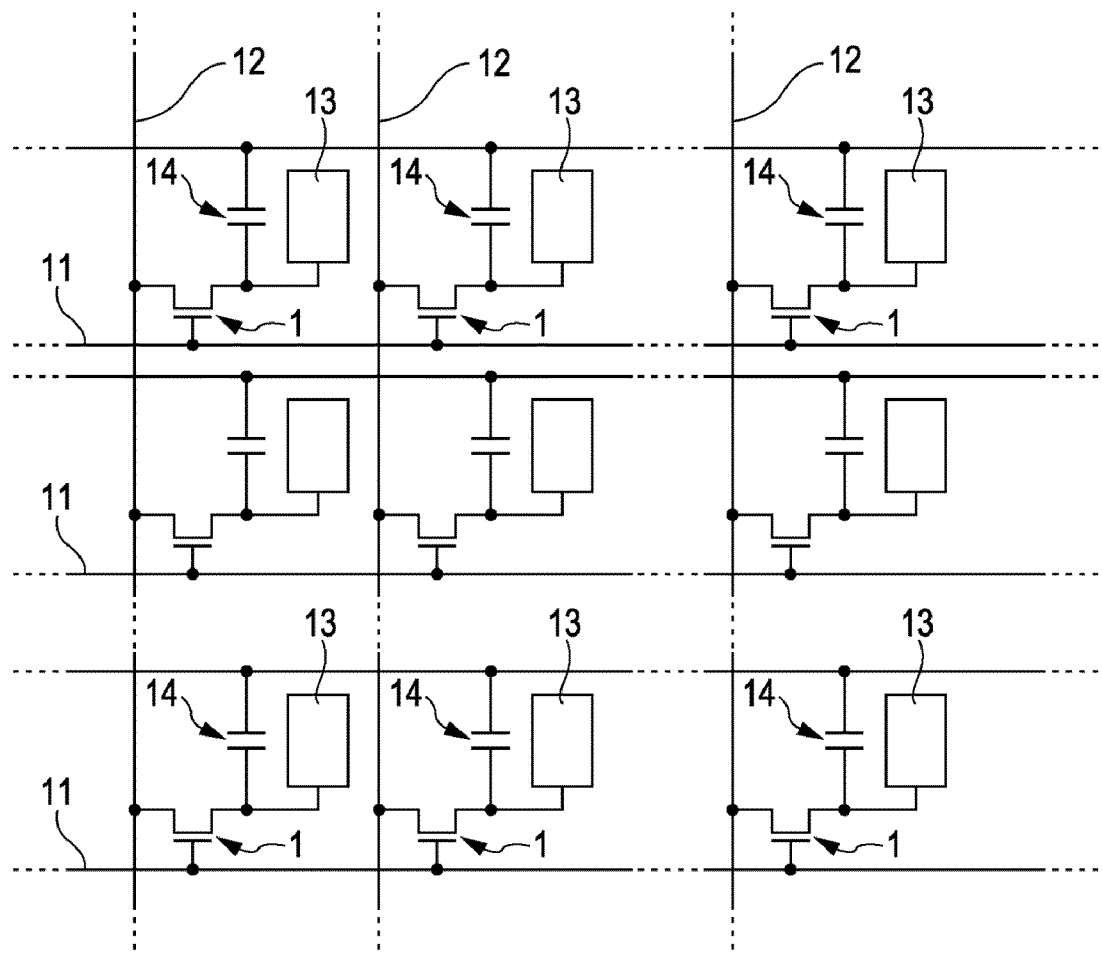
FIG. 9 is an equivalent circuit diagram of a liquid crystal device.

FIG. 8A is a plan view showing a liquid crystal device as an electro-optic device according to an embodiment of the present invention. FIG. 8B is a sectional view taken along line VIIIB-VIIIB in FIG. 8A. FIG. 9 is an equivalent circuit diagram of the liquid crystal device. The liquid crystal device of this embodiment includes the thin film transistor used as a switching element for a pixel. The thin film transistor is provided on an element substrate (TFT array substrate) 10 composed of quartz, glass, silicon, or the like shown in FIGS. 8A and 8B, and a counter substrate 20 composed of glass, quartz, or the like is provided to face the element substrate 10. The element substrate 10 and the counter substrate 20 are bonded to each other with a sealing material 52 provided in the periphery of an image display region 10a. A liquid crystal layer 50 is sealed between the element substrate 10 and the counter substrate 20 inside of the sealing material 52. In FIG. 8A, reference numeral 108 denotes a liquid crystal inlet formed by removing a portion of the sealing material 52, and reference numeral 109 denotes a sealant which seals the liquid crystal inlet 108.

In a region outside of the sealing material 52, i.e., a peripheral region outside the image display region 10a, a data line drive circuit 101 for driving data lines 12 by supplying image signals to the data lines 12 with predetermined timing and an external circuit connection terminals 102 are provided along one of the sides of the element substrate 10. In addition, scanning line drive circuits 104 for driving scanning lines (not shown) by supplying scan signals to the scanning lines with predetermined timing are provided on the element substrate 10 at positions parallel to the two sides adjacent to the one side and facing a light-shielding film 53 provided inside of the sealing material 52. Further, a plurality of wirings 105 is provided for connecting the external circuit connection terminal-sides of the scanning line drive circuits 104 provided in parallel to the two sides to the opposite side.

Further, vertical conduction terminals 107 are formed at the four corners of the sealing material 52 on the element substrate 10, and vertical conducting materials 106 are provided between the element substrate 10 and the counter substrate 20 so that the lower ends are in contact with the vertical conduction terminals 107 and the upper ends are in contact with the counter substrate 20. The vertical conducting materials 106 impart electric conduction between the element substrate 10 and the counter substrate 20.

Further, a pixel electrode 13 constituting each pixel is provided on the element substrate 10, and an alignment film 16 is provided inside (the liquid crystal layer 50 side) of the pixel electrodes 13. A counter electrode 21 is provided over the substantially whole surface of the counter substrate 20, and an alignment film 22 is provided on the inner side of the counter electrode 21. Each of the alignment films 16 and 21 is composed of a transparent organic film such as a polyimide film or the like. By rubbing the surfaces of the films, liquid crystal molecules in the liquid crystal layer 50 are oriented in a predetermined direction according to the voltage supplied to the liquid crystal layer 50.

As shown in the equivalent circuits in FIG. 9, in the liquid crystal device, the pixel electrodes 13 are arranged in a matrix in the regions partitioned by a plurality of scanning lines 11 and a plurality of data lines 12 which are wired to cross each other. The thin film transistor 1 is provided as the switching element for controlling image signals supplied to each of the pixel electrodes 13. In this embodiment, a thin film transistor having the configuration shown in FIGS. 1A, 1B, and 1C is used as the thin film transistor 1. The gate electrode 5 of the thin film transistor 1 is electrically connected to the corresponding scanning line 11 or used as the gate electrode 5 is used as the scanning line 11. The source region 33 and the drain region 34 are electrically connected to the corresponding data line 12 and the pixel electrode 13, respectively.

In this configuration, each of the thin film transistors 1 is turned on by ON signal of the corresponding scanning line 11, and an image signal supplied to the corresponding data line 12 is supplied to each pixel electrode 13. As a result, a voltage is supplied to the liquid crystal layer 50 interposed between the pixel electrodes 13 and the counter electrode 21 provided on the counter substrate 20, and thus the liquid crystal molecules are oriented in a predetermined direction, thereby providing desired information display. In each of the pixels, as shown in FIG. 9, a storage capacitor 14 is provided in parallel with the pixel electrode 13 so that the holding time of the voltage supplied to the liquid crystal layer 50 is extended by the storage capacitors 14.

As described above, by using the thin film transistor 1 as the switching element for controlling an image signal supplied to each of the pixel electrodes 13 of the liquid crystal device, it is possible to increase the ON-current and decrease the leakage current. In particular, by using the thin film transistor 1 having the configuration shown in FIGS. 1A to 1C in this embodiment, it is possible to not only improve the performance of the thin film transistor but also satisfactorily prevent the problem of a conventional example that two types of transistors are formed due to deterioration of the end surfaces of the semiconductor layer in the channel width direction during the manufacture and the occurrence of so-called hump.

Although, in this embodiment, an example in which the thin film transistor 1 is used as a switching element for a pixel in a liquid crystal device is described, the thin film transistor 1 can be used as a switching element for a drive circuit. In this case, the same operation and effect as described above can be achieved. The thin film transistor can be applied to not only a liquid crystal device having the above-described configuration but also a reflective liquid crystal device (LCOS) in which elements are formed on a silicon substrate. Further, application is not limited to a liquid crystal device, the present invention can be applied to other various electro-optic devices, such as an electroluminescence device, an organic EL display, a plasma display (PDP), an electrophoretic display, a field emission display (FED, SED), and the like. In this case, the same operation and effect as described above can be achieved.

[Electronic Apparatus]

The present invention can also be applied to electronic apparatuses such as a projective display using the above-described electro-optic device as a light valve. The whole configuration of a projective color display using the above-described liquid crystal device as a light valve is described below as an example.

Figure 10:
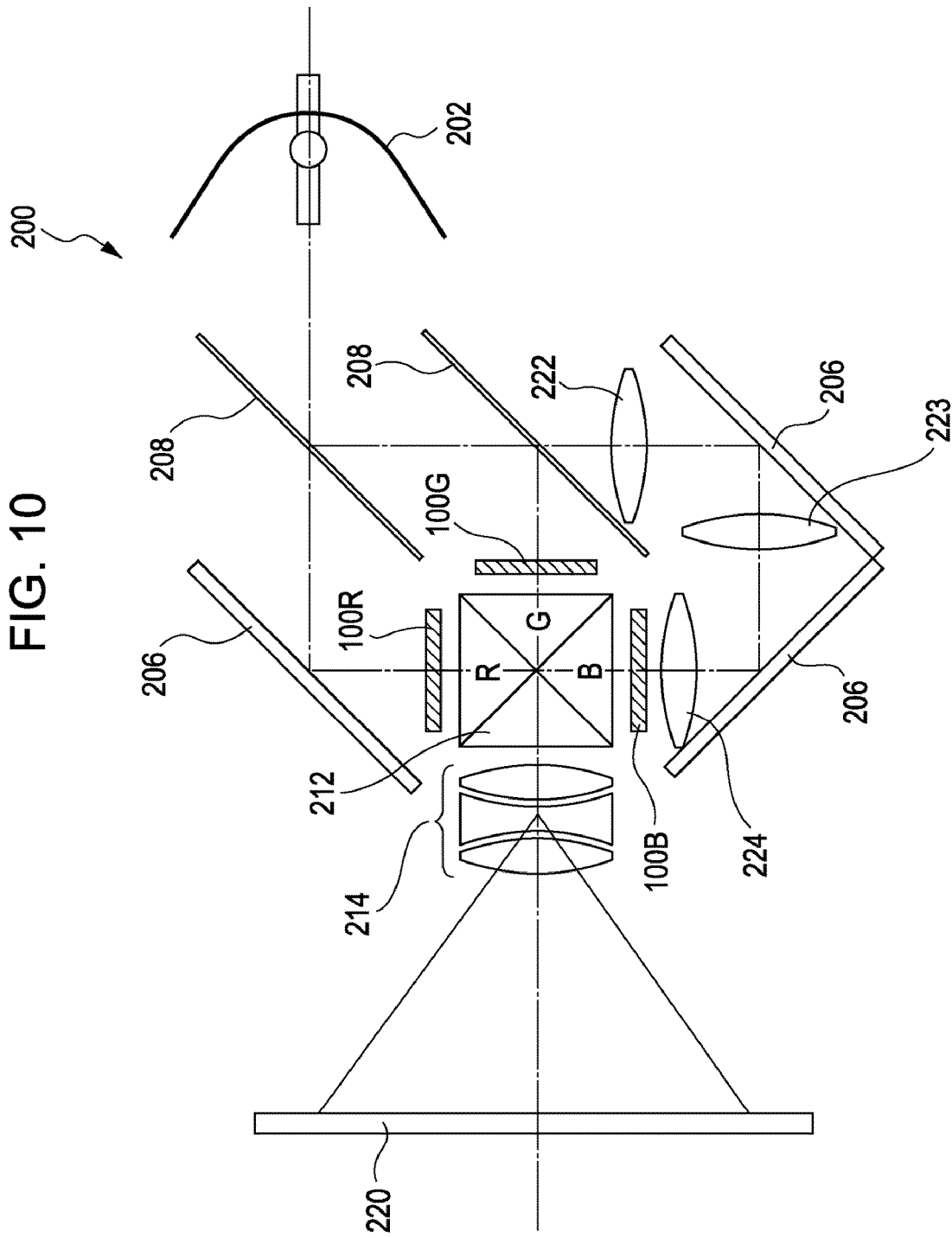
FIG. 10 is an explanatory view of a projection-type color display device as an electro-optic device to which the present invention is applied.

FIG. 10 shows the schematic configuration of a liquid crystal projector as an example of the projective color display. A liquid crystal projector 200 of this example includes three liquid crystal modules each including a liquid crystal device in which drive circuits are mounted on an element substrate, the three liquid crystal modules being used as RGB light valves 100R, 100G, and 100B. In the liquid crystal projector 200, when incident light is emitted from a white light source lamp unit 202, such as a metal halide lamp or the like, the light is separated into light components R, G, and B corresponding to the three primary colors RGB by three mirrors 206 and two dichroic mirror 202 and the light components R, G, and B are led to the light valves 100R, 100G, and 100B, respectively. In this case, in particular, the component B is led through a relay lens system including an incidence lens 222, a relay lend 223, and an emission lens 224 in order to prevent a light loss due to a long optical path. The light components corresponding to the three primary colors are modulated by the valves 100R, 100G, and 100B, respectively, again combined by a dichroic prism 212, and then projected as a color image on a screen 220 through a projection lens 214.

Further, the present invention can be applied to not only the projective liquid crystal display such as the above-described projector, but also an electronic apparatus including an electro-optic device such as the above-described liquid crystal device or the like. For example, the present invention can be applied to a portable or disk-top information apparatus including the above-described liquid crystal device as a display portion. Specifically, the present invention can be applied to various electronic apparatuses, such as a cellular phone, a wristwatch, a word processor, a computer, PDA, an electronic notebook, a television, a camera, a car navigation system, a picture telephone, a POS terminal, and the like.

What is claimed is:

1. A thin film transistor comprising:
a gate electrode; and
a semiconductor layer including;
  a channel region;
  a source region;
  a drain region;
  a low-concentration impurity region provided between the channel region and the source or drain region, the low-concentration impurity region being doped with a first conductivity-type impurity; and
  a high-concentration impurity region having a higher impurity concentration than that in the channel region, the high-concentration impurity region overlapping with at least one edge portion of the gate electrode, the high-concentration impurity region being doped with a second conductivity-type impurity;
wherein the semiconductor layer further includes a both conductivity-type impurity region provided between the high-concentration impurity region and the source or drain region in an area not overlapped by the gate electrode, the both conductivity-type impurity region being doped with both the first conductivity-type impurity and the second conductivity-type impurity.

2. The thin film transistor according to claim 1, wherein the high-concentration impurity region is disposed at at least one of the ends of the region of the semiconductor layer in the channel length direction, the region overlapping the gate electrode.

3. The thin film transistor according to claim 1, wherein the high-concentration impurity region is disposed at each end of the region of the semiconductor layer in the channel width direction, the region overlapping the gate electrode.

4. The thin film transistor according to claim 1, wherein the channel region and the high-concentration impurity region have different sheet resistances.

5. The thin film transistor according to claim 1, wherein the sheet resistance of the high-concentration impurity region is lower than that of the channel region.

6. An electro-optic device comprising the thin film transistor according to claim 1 used as a switching element for a pixel, the drain region of the thin film transistor being electrically connected to a pixel electrode of the pixel.

7. The electro-optic device according to claim 6, wherein the thin film transistor and the pixel electrode are provided corresponding to each of the intersections of scanning lines and data lines, the gate electrode of the thin film transistor is electrically connected to the corresponding scanning line or serves as the scanning line, one of the regions formed on both sides of the channel region in the semiconductor layer of the thin film transistor is electrically connected to the corresponding data line, and the other is electrically connected to the pixel electrode so that the wiring resistance of the region connected to the pixel electrode is higher than that of the region connected to the data line.

8. An electronic apparatus comprising the electro-optic device according to claim 7, wherein the electro-optic device is a display or a light valve of the electronic apparatus.

* * * * *